United States Patent [19]
Rohatgi et al.

[11] Patent Number: 5,766,964
[45] Date of Patent: *Jun. 16, 1998

[54] PROCESSES FOR PRODUCING LOW COST, HIGH EFFICIENCY SILICON SOLAR CELLS

[75] Inventors: Ajeet Rohatgi, Marietta; Parag Doshi, Altanta; John Keith Tate, Lawrenceville; Jose Mejia, Atlanta; Zhizhang Chen, Duluth, all of Ga.

[73] Assignee: Georgia Tech Research Corporation, Atlanta, Ga.

[ * ] Notice: The term of this patent shall not extend beyond the expiration date of Pat. No. 5,510,271.

[21] Appl. No.: 579,074

[22] Filed: Dec. 22, 1995

Related U.S. Application Data

[63] Continuation-in-part of Ser. No. 303,340, Sep. 9, 1994, Pat. No. 5,510,271.

[51] Int. Cl.$^6$ .................................................. H01L 31/18
[52] U.S. Cl. .......................... 437/2; 437/142; 437/143; 437/145; 437/152; 437/160; 437/173; 437/248; 437/929; 437/942; 136/258; 136/261
[58] Field of Search ........................ 437/2, 4–5, 142–143, 437/145, 152, 160, 173, 248, 929, 942; 136/258 PC, 261

[56] References Cited

U.S. PATENT DOCUMENTS 5,510,271  4/1996  Rohatgi et al. ............................ 437/2

OTHER PUBLICATIONS

Z. Chen et al., "A Novel and Effective PECVD SiO$_x$/SiN Antireflection Coating for Si Solar Cells," IEEE Trans. on Electron Devices, vol. 40, No. 6, Jun. 1993, pp. 1161–1165.

L. Jin–Chai et al., "Applications of Fast Thermal Processing of Implanted Crystalline Silicon in Solar Cell Technology," Proceedings of 18th IEEE Photovoltaic Specialists Conference (IEEE, Las Vegas, 1985), pp. 1100–1104.

A. Usami et al., "New Junction Formation Process for Polycrystalline Silicon Solar Cells by Light Induced Diffusion from a Spin–On Source," Proceedings of 18th IEEE Photovoltaic Specialists Conference (IEEE, Las Vegas, 1985), pp. 1078–1083.

A. Usami et al., "Shallow Junction Formation for Silicon Solar Cells by Light–Induced Diffusion of Phosphorus from a Spin–On Source," Proceedings of 18th IEEE Photovoltaic Specialists Conference (IEEE, Las Vegas, 1985), pp. 797–803.

(List continued on next page.)

*Primary Examiner*—Aaron Weisstuch
*Attorney, Agent, or Firm*—Thomas, Kayden, Horstemeyer & Risley

[57] ABSTRACT

Processes which utilize rapid thermal processing (RTP) are provided for inexpensively producing high efficiency silicon solar cells. The RTP processes preserve minority carrier bulk lifetime τ and permit selective adjustment of the depth of the diffused regions, including emitter and back surface field (bsf), within the silicon substrate. In a first RTP process, an RTP step is utilized to simultaneously diffuse phosphorus and aluminum into the front and back surfaces, respectively, of a silicon substrate. Moreover, an in situ controlled cooling procedure preserves the carrier bulk lifetime τ and permits selective adjustment of the depth of the diffused regions. In a second RTP process, both simultaneous diffusion of the phosphorus and aluminum as well as annealing of the front and back contacts are accomplished during the RTP step. In a third RTP process, the RTP step accomplishes simultaneous diffusion of the phosphorus and aluminum, annealing of the contacts, and annealing of a double-layer antireflection/passivation coating SiN/SiO$_x$. In a fourth RTP process, the process of applying front and back contacts is broken up into two separate respective steps, which enhances the efficiency of the cells, at a slight time expense. In a fifth RTP process, a second RTP step is utilized to fire and adhere the screen printed or evaporated contacts to the structure.

22 Claims, 16 Drawing Sheets

OTHER PUBLICATIONS

J-F Joly et al., "Rapid Thermal Annealing of P+ and $PF_5$ Implanted Silicon, and Its Application to Solar Cells," Proceedings of 18th IEEE Photovoltaic Specialists Conference (IEEE, Las Vegas, 1985), pp. 1756–1757.

R. Campbell et al., "Simultaneous Junction Formation Using a Directed Energy Light Source," J. Electrochem. Society, vol. 133, No. 10, pp. 2210–2211 (1986).

B. Hartiti et al., "Optical Thermal Processing for Silicon Solar Cells," 11th E.C. Photovoltaic Solar Energy Conference (Montreux, Switzerland, 1992) pp. 420–422.

B. Hartiti et al., "Multicrystalline Silicon Solar Cells Processed by Rapid Thermal Processing," Proceedings of 23rd IEEE Photovoltaic Specialists Conference (IEEE, Louisville, 1993), pp. 224–229.

R. Schindler et al., "Rapid Optical Thermal Processing of Silicon Solar Cells," Proceedings of 23rd IEEE Photovoltaic Specialists Conference (IEEE, Louisville, 1993), pp. 162–166.

R. Peruzzi et al., "Realization of a Wholly Screen Printed Silicon Solar Cell Production Line," 12th Photovoltaic Solar Energy Conference, Commission of the European Communities, Proceedings of the International Conference, Apr. 11–15, 1994.

S. Sivoththaman et al., "High Efficiency Multi–crystalline Silicon Solar Cells: Comparison Between Conventional and Rapid Thermal Processes," 12th E.C. Photovoltaic Solar Energy Conference, Apr. 1994, pp. 47–51.

PROCESSES FOR PRODUCING LOW COST, HIGH EFFICIENCY SILICON SOLAR CELLS

This document is a continuation-in-part of the application entitled "PROCESSES FOR PRODUCING LOW COST, HIGH EFFICIENCY SILICON SOLAR CELLS," filed Sep. 9, 1994, by Ajeet Rohatgi et al., that was assigned Ser. No. 08/303,340, now U.S. Pat. No. 5,510,271 issued Apr. 23, 1996.

The U.S. Government has a paid-up license in the invention and the right in limited circumstances to require the patent owner to license others on reasonable terms as provided by the terms of Contract Nos. E21-H21 and E21-H31 awarded by the U.S. Department of Energy.

FIELD OF THE INVENTION

The present invention generally relates to integrated fabrication technology, and more particularly, to new processes for inexpensively producing high efficiency silicon (Si) solar cells.

BACKGROUND OF THE INVENTION

To achieve large scale acceptance and widespread use of photovoltaic (PV) systems for the generation of electricity and electrical power, new processes must be developed for manufacturing solar cells on a commercial scale with much less cost (directly related to fabrication time) and with much higher cell efficiencies than known fabrication techniques. Today, conventional photovoltaic modules cost about $4.00 per watt (w) and can produce electricity at a rate of about $0.25 per kilowatt hour (kwh). A factor of two in cost reduction is needed to make photovoltaic systems attractive for peak power load applications, and a reduction by a factor of at least three would make photovoltaic systems much more competitive with conventional energy sources for base load utility applications. No photovoltaic material or technology has yet been able to achieve both the cost and efficiency goals simultaneously. Generally, the efficient PV systems are too expensive, and the cheaper PV systems are not efficient enough.

Conventional processes for manufacturing solar cells involve several separate, long, furnace diffusions and oxidations at high temperatures. Moreover, these furnace diffusion and oxidation processes require extensive time periods and meticulous cleaning, prolonged cell processing, and use of large quantities of chemicals, gases, etc. Some researchers have attempted to shorten the fabrication time by using rapid thermal processing (RTP), also known in the art as rapid thermal annealing (RTA), for fabricating silicon solar cells. In general, RTP is a photo-assisted thermal annealing process which utilizes a light radiating source for heating purposes and, in particular, for generating radiant heat.

As examples of RTP research in the field of solar cell fabrication, see the following publications: J. F. Joly, et al., *Proceedings of 18th IEEE Photovoltaic Specialists Conference*, p. 1756 (IEEE, Las Vegas, 1985); R. Campbell, et al., *J. Electrochem. Soc.*, v. 133, p. 2210 (1986); B. Hartiti, et al., *11th E. C. Photovoltaic Solar Energy Conference*, p. 420 (Montreux, Switzerland, 1992); B. Hartiti, et al., *Proceedings of 23rd IEEE Photovoltaic Specialists Conference*, p. 224 (IEEE, Louisville, 1993); and R. Schindler, et al., *Proceedings of 23rd IEEE Photovoltaic Specialists Conference*, p. 162 (IEEE, Louisville, 1993). However, as is generally known in the industry and is apparent from the foregoing publications, researchers have had only very limited success in using RTP to produce solar cells of high efficiency.

One reason is that RTP is susceptible to generating electrically-active defects, or traps. In other words, RTP significantly reduces the bulk lifetime t of minority carriers by freezing grown-in or process-induced impurities to form electrically active traps which assist in recombination of photo-generated carriers. These traps undesirably inhibit generation of electricity in a solar cell during excitation by light. For a discussion of the adverse effects of RTP on minority carrier bulk lifetime t, see A. Rohatgi, et al., *Silicon Processing*, ASTM STP, p. 804; and also D. C. Gupta, *American Society for Testing and Materials* p. 389 (1983).

Because of the foregoing reduction in minority carrier bulk lifetime t, one researcher has implemented a further separate annealing process at a high temperature after the RTP step in order to recover minority carrier bulk lifetime t. R. Campbell, et al., *J. Electrochem. Soc.* v. 133, p. 2210 (1986). However, this post-RTP anneal mitigates the attractiveness of RTP due to moderate cell efficiency and additional cost and time.

Another reason why researchers have had only slight success in using RTP to produce high efficiency solar cells it that it is difficult to obtain desired diffusion profiles with RTP. More specifically, in the manufacture of a solar cell, n-type and/or p-type materials are typically diffused into a silicon substrate to form a diffused region(s) and consequently a p-n junction(s) for generating electricity. However, when using RTP, it is difficult to obtain a desired depth for the diffused region(s), and particularly, shallow depths. Shallow junctions can cut down on undesirable heavy doping effects.

SUMMARY OF THE INVENTION

An object of the invention is to overcome the deficiencies and inadequacies of the prior art as noted above and as generally known in the industry.

Another object of the present invention is to provide a process for producing low cost, high efficiency silicon solar cells.

Another object of the present invention is to provide a process for inexpensively producing highly efficient silicon solar cells on a mass scale.

Another object of the present invention is to provide a process for producing silicon solar cells with optimized minority carrier bulk lifetime t.

Another object of the present invention is to provide a process for producing silicon solar cells having desired diffusion profiles, and particular, narrow depths and optimum surface doping concentrations.

Another object of the present invention is to provide a process for producing silicon solar cells which requires much less time than other processes which are known in the art.

Another object of the present invention is to provide a process for producing silicon solar cells which requires a much less thermal budget than other processes which are known in the art.

Briefly described in simple terms, the present invention provides for several RTP processes for producing solar cells for generating electrical energy from light. The RTP processes utilize an in situ controlled cooling procedure for producing a p-n junction in a silicon substrate, while preserving carrier bulk lifetime t within the silicon substrate and while permitting selective adjustment of the depth of the diffused region within the silicon substrate.

More specifically, a first RTP process involves the following steps. A dopant, for example, an n-type dopant containing material such as phosphorous (P), is applied to a front surface (receives light during cell operation) of a silicon substrate, for instance, a substrate of p-type silicon. Moreover, another dopant containing material, for example, a p-type dopant such as aluminum (Al) is applied to a back surface of the silicon substrate. After the dopant containing materials have been applied to the silicon substrate, the combination of the substrate and the dopant containing materials are heated with a light radiating source using a rapid thermal processing (RTP) system so that both the dopants diffuse concurrently into the silicon substrate to form front and back diffused regions (in the preferred embodiment, $n^+$ and $p^+$, respectively), and so that a solar cell body is formed.

Next and significantly, an in situ controlled cooling procedure is employed to preserve the bulk lifetime t of minority carriers within the silicon region and to permit selective adjustment of the depth of the diffused regions. During this procedure, the RTP heat applied to the silicon substrate and dopant containing material is selectively reduced at a first cooling rate (preferably, 0.33° C./sec) which preserves the carrier bulk lifetime t within the bulk silicon region. The first cooling rate is slower than the natural cooling rate of the substrate and dopants toward ambient temperature. After a predetermined duration of heat reduction at the first cooling rate, the substrate is permitted to naturally decrease in temperature to the ambient temperature via termination of the RTP applied heat. Moreover, the predetermined duration is directly proportional to the depth of the diffused regions within the silicon substrate, and particularly the diffused region which creates the electricity-generating p-n junction.

Front and back metal contacts are applied over the front and back diffused regions of the silicon substrate, respectively, via any conventional process, but preferably via a screen printing and annealing process. The metal contacts may be produced from any suitable metallic material, including for example, silver (Ag), titanium (Ti), and alloys thereof. Optionally, an antireflection/passivation layer, for instance, ZnS/MgF or $SiN/SiO_x$, is applied over the front surface. The result of the foregoing novel process is a low cost, highly efficient silicon solar cell.

A second RTP process in accordance with the present invention is performed similarly to the first RTP process for producing high efficiency silicon solar cells. However, importantly, in the second RTP process, annealing of the front and back contacts is accomplished during the RTP step in addition to simultaneous diffusion of both dopants, i.e., phosphorous into the front surface and aluminum into the back surface. This process further reduces the time period and cost necessary to fabricate high quality silicon solar cells.

A third RTP process in accordance with the present invention is performed similarly to the second RTP process for producing high efficiency silicon solar cells. However, in the third RTP process, a first RTP step accomplishes simultaneous diffusion of the phosphorous and aluminum, annealing of the contacts, and a second RTP step accomplishes annealing of a very efficient double-layer antireflection/passivation coating $SiN/SiO_x$.

In a fourth RTP process, the process of applying front and back contacts is broken up into two separate respective steps, which enhances the efficiency of the cells, at a slight time expense. The fourth RTP process can be summarized as follows: cleaning the surfaces of a silicon substrate; applying a first dopant containing material to the back surface of the substrate; applying a second dopant containing material to the back surface of the substrate; applying a second dopant containing material to the front surface of the substrate; applying rapid thermal processing to the combination of the substrate and the dopants to cause the first and second dopant containing materials to diffuse into the substrate; controlling cooling of the combination so that carrier lifetime in the substrate is preserved; applying an antireflection coating to the diffused front surface; applying and annealing a front contact to the antireflection coating; and finally, applying and annealing a rear contact to the back diffused surface.

In a fifth RTP process, a second RTP step is employed to adhere the contacts to the structure. This process can be broadly summarized as follows: applying first and second dopant containing materials on the respective front and back surfaces of a silicon substrate to form a combination; applying rapid thermal processing to the combination to cause the first and second dopant containing materials to diffuse into the respective surfaces of the substrate; applying an antireflection coating to the front diffused surface of the substrate; applying a front contact to the antireflection coating; applying a back contact to the back diffused surface of the substrate; and applying rapid thermal processing to adhere the front and back contacts to the antireflection coating and the back surface of the, respectively.

In addition to accomplishing all of the aforementioned objects, the present invention has many other additional advantages over the prior art, a few examples of which are indicated hereafter.

An advantage of the present invention is that silicon solar cells have been formed with record high efficiencies of 16.9%.

An advantage of the present invention is that other in situ processing steps can be accomplished and/or completed during the RTP step for further optimizing the silicon solar cells and the process for making the same. These further processing steps could include, as examples, diffusion, oxidation, annealing, deposition, and/or surface cleaning.

Another advantage of the present invention is that it requires a much shorter processing time that prior art processes.

Another advantage of the present invention is that it requires a lower thermal budget and lower power consumption than prior art processes.

Another advantage of the present invention is that a junction adjacent both the front and back surfaces of a silicon substrate can be formed simultaneously.

Another advantage of the present invention is that the RTP processes require fewer cleaning steps than prior art processes for fabricating silicon solar cells.

Another advantage of the present invention is that the RTP processes require lesser amounts of chemicals, gases, etc. than prior art processes for fabricating silicon solar cells.

Another advantage of the present invention is that the RTP processes can be utilized to achieve very shallow electricity-generating p-n junctions in silicon solar cells. Shallow junctions cut down on heavy doping effects.

Another advantage of the present invention is that lower quality silicon, such as crucible-frown commercial silicon, can be utilized to produce solar cells with much higher operation efficiencies which were historically limited to higher quality silicon, such as float zone silicon.

Other objects, features, and advantages of the present invention will become apparent to one of skill in the art upon examination of the following drawings and detailed description. It is intended that these additional objects, features, and advantages be incorporated herein.

BRIEF DESCRIPTION OF THE DRAWINGS

The present invention can be better understood with reference to the following drawings. The drawings are not necessarily to scale, emphasis instead being placed upon clearly illustrating principles of the present invention.

DETAILED DESCRIPTION OF THE PREFERRED EMBODIMENTS

The RTP methods of the present invention will now be described in detail relative to forming $n^+$-p-$p^+$ silicon solar cells. However, this type of cell was selected as merely an example for application of the methods, and the principles of these novel RTP methods can be applied to the formation of other types of solar cells and to cells with different construction materials and dopants.

Figure 1:
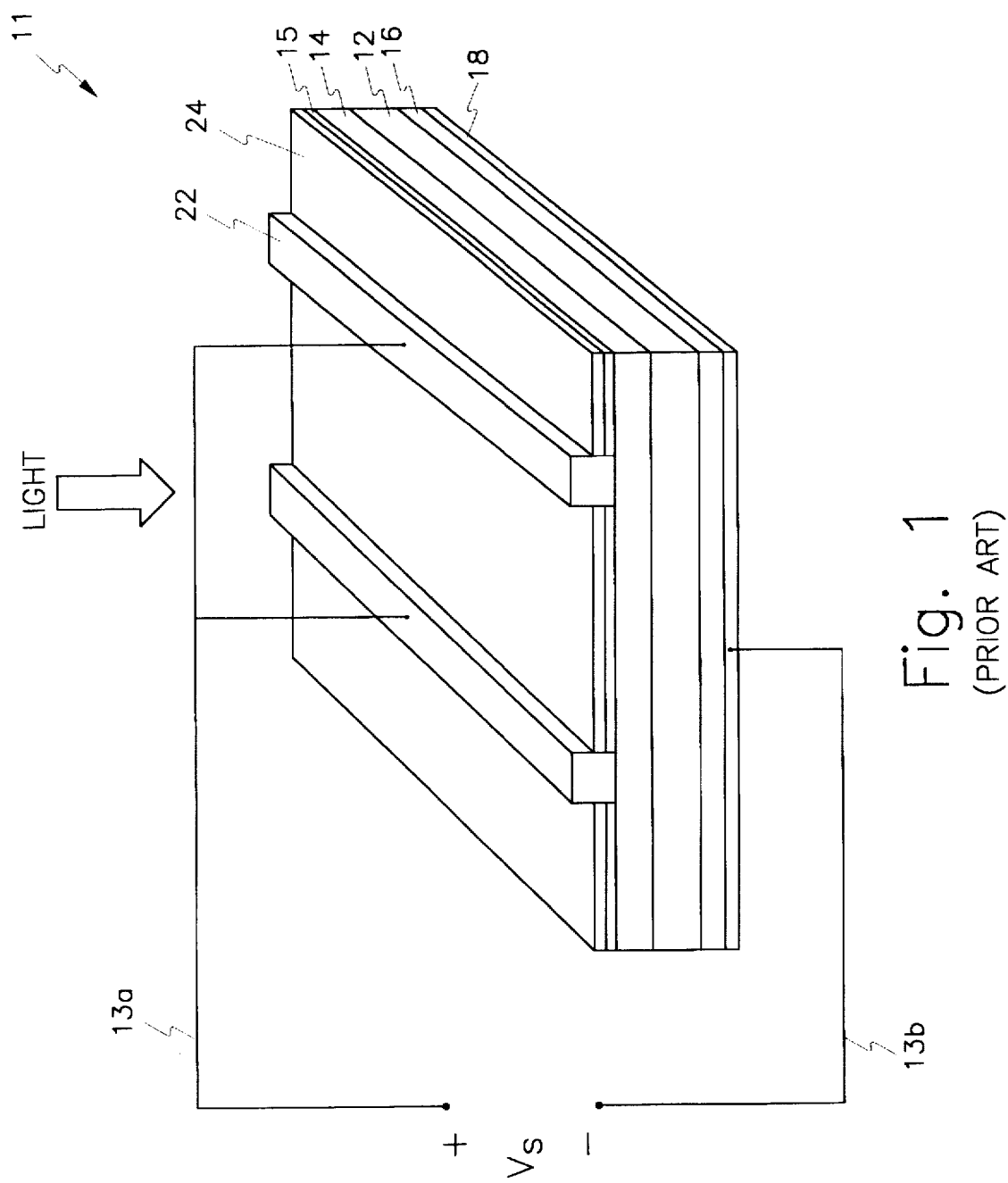
FIG. 1 is a schematic diagram of a conventional silicon solar cell.

FIG. 1 illustrates a conventional $n^+$-p-$p^+$ solar cell 11 for receiving light and for producing a source voltage $V_o$ from the incident light. In structure, the solar cell 11 typically comprises a p-doped silicon region 12, which is contiguous with an $n^+$-diffused silicon region 14, or emitter, to thereby form a p-n junction. There is a very high electric field at the p-n junction. The p-n junction separates photo-generated electron-hole pairs and generates electrical current flow when excited by light, as shown. Specifically, when excited, electrons flow toward the n'-region, and holes flow toward the p-region.

Furthermore, a silicon oxide ($SiO_x$) layer 15 is optionally formed over the n'-doped silicon region 14 for passivation purposes. A $p^+$-doped silicon region 16, or a back surface field (bsf), is optionally placed adjacent the back of the silicon solar cell 11 for facilitating generation of current flow by repelling electrons and by more readily attracting holes toward the back of the cell 11. A metal layer 18, serving as a back electrical contact, is situated adjacent the $p^+$-doped layer 16. A grid, or network, of metal strips 22 is disposed over and contiguous with the $n^+$-doped layer 14 and serves as a front electrical contact for the silicon solar cell 11. Finally, an antireflective coating 24 may optionally be situated over the silicon oxide layer 15 for optimizing the capture of light and minimizing relfections of light from the junction created by layers 12, 14.

Figure 2:
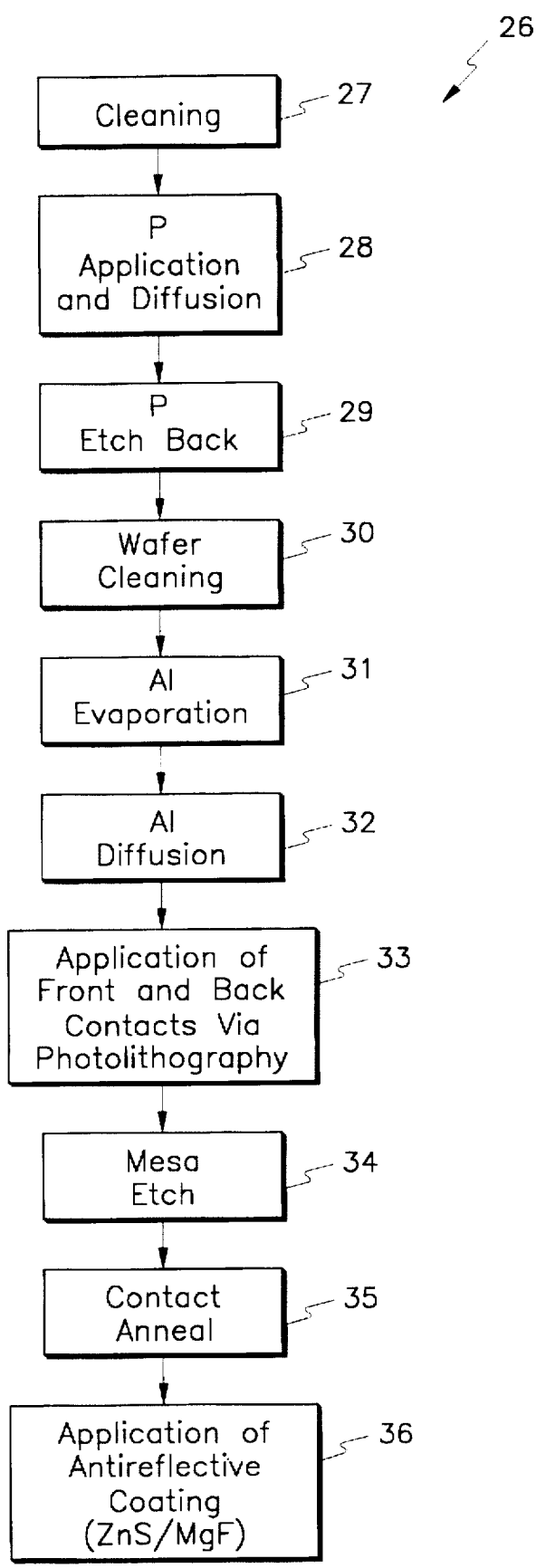
FIG. 2 is a flow chart illustrating a conventional process for producing the silicon solar cell of FIG. 1.
Figure 3A:
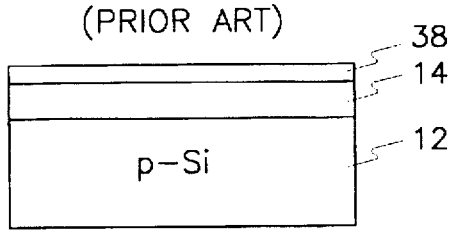
FIGS. 3A through 3M are schematic illustrations showing the various steps of the conventional process of FIG. 2 for producing the silicon solar cell of FIG. 1.

A conventional process for producing the $n^+$-p-$p^+$ silicon solar cell 11 of FIG. 1 is shown by way of a flow chart 26 in FIG. 2 and by way of a schematic illustration in FIGS. 3A through 3M. As indicated in flow chart block 27 of FIG. 2, a p-doped silicon substrate 12 is intitially cleaned. Next, as indicated in flow chart block 28, a phosphorus (P) doped glass layer 38 is applied to the p-doped silicon substrate 12. After the phosphorus doped glass layer 38 has been applied to the silicon substrate 12, the silicon substrate 12 and phosphorus layer 38 are heated so that part of the phosphorus doped glass layer 38 diffuses into the underlying p-type boron-doped silicon substrate 12, thereby forming an $n^+$-doped silicon region 14 under the phosphosilica glass layer 38. FIG. 3A shows the phosphorus doped glass layer 38, the underlying $n^+$-doped diffused region 14, and the underlying p-doped silicon region 12.

Figure 3B:
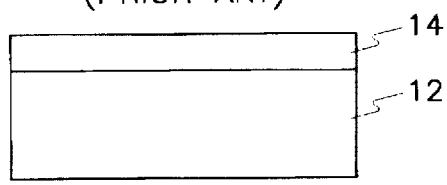

As indicated in flow charge block 29, and as illustrated in FIG. 3B, the phosphosilica glass layer 38 is etched away from the substrate structure, leaving behind the $n^+$-doped silicon region 14 and the p-doped silicon region 12. The substrate structure is again cleaned to prevent contamination of phosphorus into later processing steps, as indicated in flow chart block 30 of FIG. 2.

Figure 3C:
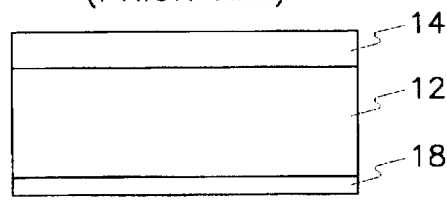
Figure 3D:
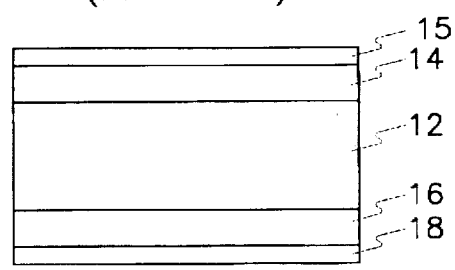

Next, as indicated in flow chart block 31 of FIG. 2 and as illustrated in FIG. 3C of FIG. 3, an aluminum layer 18 is applied to the back surface of the silicon substrate 12, typically via a conventional evaporation process. Further, as indicated in flow chart block 32 of FIG. 2 and as illustrated in FIG. 3D of FIG. 3, the silicon substrate 12 is heated so that a silicon oxide layer 15 is produced over the phosphorus-doped n+ layer 14 and the aluminum layer 18 diffuses into the silicon substrate 12, thereby forming a p⁺-doped silicon region 16.

Figure 3E:
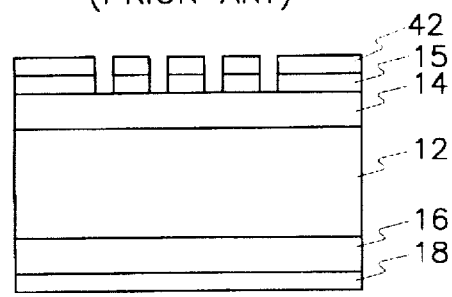
Figure 3F:
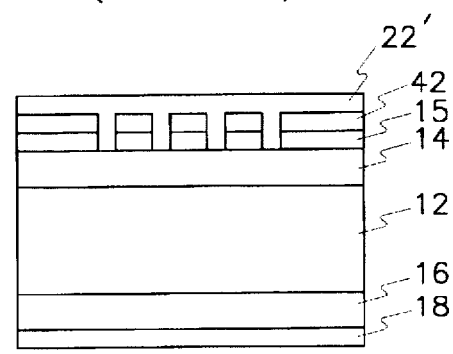
Figure 3G:
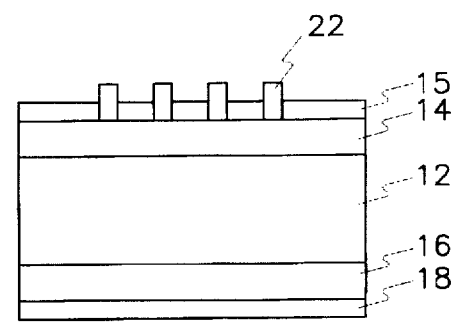

As indicated in flow chart block 33, the front and back contacts 22, 18 (FIG. 1) are typically applied to the substrate structure via a conventional photolithography process. The photolithography process is illustrated in FIGS. 3E through 3K. As shown in FIG. 3E, a photoresist (PR) 42 is situated over the oxide layer 15 and is utilized to pattern the silicon oxide layer 15. Next, as indicated in FIG. 3F, a metal layer 22', generally a titanium silver alloy (Ti/Ag), is applied over the photoresist 42. A Ti/Ag alloy is often used because Ti adheres will to silicon, and Ag is an excellent conductor. As shown in FIG. 3G, the photoresist 42 is lifted off along with the upper part of the metal layer 22'. This concludes fabrication of the front contacts 22.

Figure 3H:
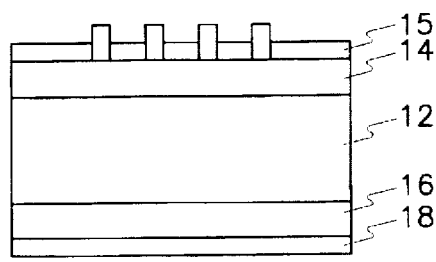

In order to complete the singular back contact 18 (FIG. 1), another metal layer, usually Ti/Ag, is applied over the aluminum layer 18, as shown in FIG. 3H. If the aluminum layer 18 is thick enough, another metal layer, such as the Ti/Ag, may be unnecessary and optional.

Figure 3K:
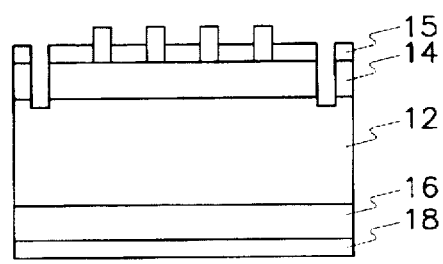
Figure 3I:
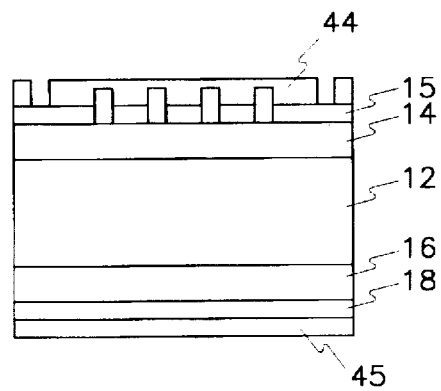

Next, a conventional photolithography process is utilized to pattern the perimeter of the substrate structure, as shown in FIG. 3I, to define a cell. This can also be cone by dicing the cell out by a saw, as is well known in the art. This may be unnecessary if one full cell is made on each wafer, as is possible. Photoresists 44, 45 are positioned at the front and back surfaces, respectively, as shown. Next, as shown in FIG. 3J, mesa etching is employed using any conventional technique in order to produce cavities leading to the p-doped silicon region 12. As shown in FIG. 3K, the photoresist layers 44, 45 are removed.

Figure 3L:
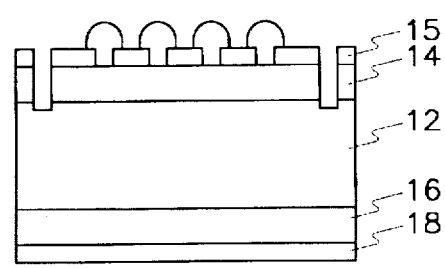
Figure 3J:
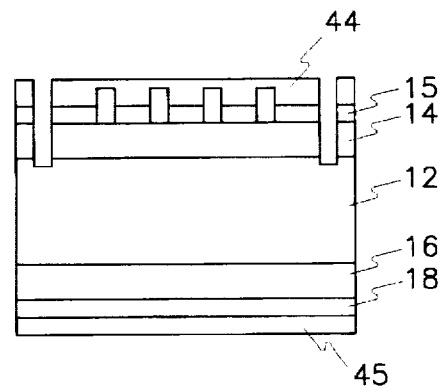

As shown in Flow chart block 34 and as illustrated in FIG. 3L, the front contacts 22 are optionally plated with silver to enhance electrical conductivity and then the entire substrate structure is heated via a conventional annealing process. The annealing process causes the contacts to adhere to the substrate structure so that a monolithic body is created.

Figure 3M:
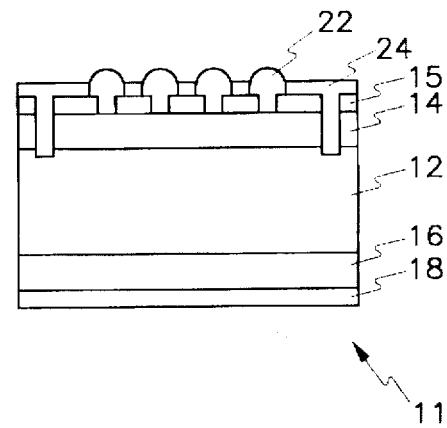

Finally, as indicated in flow chart block 36 and as illustrated in FIG. 3M, an antireflective coating 24 is optionally applied over the structure, which will ultimately inhibit reflections of light from the cell when the cell is in use. The antireflection coating has historically been a double-layer ZnS/MgF coating in the industry. Moreover, the ZnS/MgF coating is applied via a lengthy two-stage sintering process.

FIRST RTP PROCESS

Figure 4:
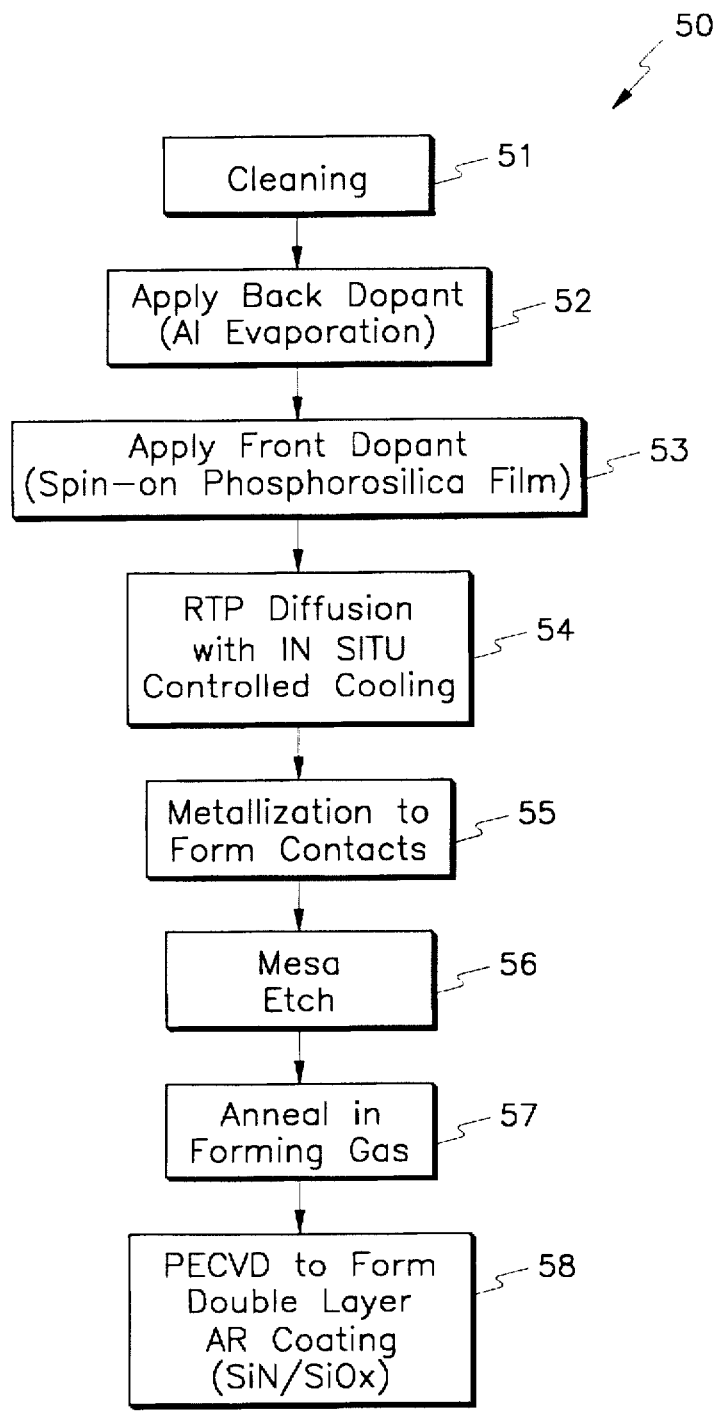
FIG. 4 is a first RTP process in accordance with the present invention for producing the silicon solar cell of FIG. 1 at a much lower cost, in much less time, and with a comparable cell efficiency relative to the conventional process of FIG. 2.

FIG. 4 shows a flow chart illustrating a first RTP process 50 in accordance with the present invention. The first RTP process 50 is essentially a simplified and cost effective fabrication technique that significantly reduces the cell process time, thermal budget, and substrate cleaning steps, while maintaining cell efficiency. Moreover, the first RTP process 50 enables optimum preservation of minority carrier bulk lifetime t, unlike prior art processes which utilize RTP.

Initially, in the first RTP process 50, the silicon substrate 12 is cleaned, as indicated in flow charge block 51. In the preferred embodiment, the silicon substrate 12 is cleaned with 4:1 $H_2SO_4:H_2O_2$ for 5 minutes followed by a 1 minute 40:1 $HNO_3:HF$ treatment, a 20 second dip in 10:1 $H_2O:HF$, an 8 minute boil and 1:1:5 $HCl:H_2O_2:H_2O$, and a final 20 second dip in 10:1 $H_2O:HF$. The silicon substrate 12 is then rinsed with a suitable liquid, such as water, and is blow dried with nitrogen gas $N_2$ or another suitable inert gas.

Next, the back contact 18 (FIG. 1) is applied to the silicon substrate 12, as is indicated in flow chart block 52. The back contact 18 may be any suitable material, but aluminum (Al) is preferred in that it can serve the dual purpose of creating the p⁺-diffused region within the silicon substrate 12 and can also be used as the back contact 18, if thick enough. Moreover, the metal utilized as the back contact 18 may be applied using any conventional technique, for example but not limited to, an evaporation technique. In the preferred embodiment, an aluminum layer with a thickness of 1 mm was evaporated onto the back of the silicon substrate 12 (FIG. 1).

Next, as indicated in flow chart block 53, the first dopant containing material (which forms the n⁺-diffused region 14 in the silicon substrate 12) is applied to the front surface of the silicon substrate 12. Preferably, a 150-nm thick phosphorus silica film with a phosphorus concentration of $1 \times 10^{21}$ P-atoms cm³ was spun onto the front side of the silicon substrate 12. Any suitable dopant and process for application of the same onto the silicon substrate 12 may be utilized.

The substrate structure is next placed in a conventional RTP system to provoke simultaneous diffusion of both the front and back dopants into the contiguous silicon substrate 12. In the preferred embodiment, the silicon substrate 12 is placed on the suscepter within the RTP system, with the spin-on phosphorus film facing away from the halogen heating lamps.

Figure 5:
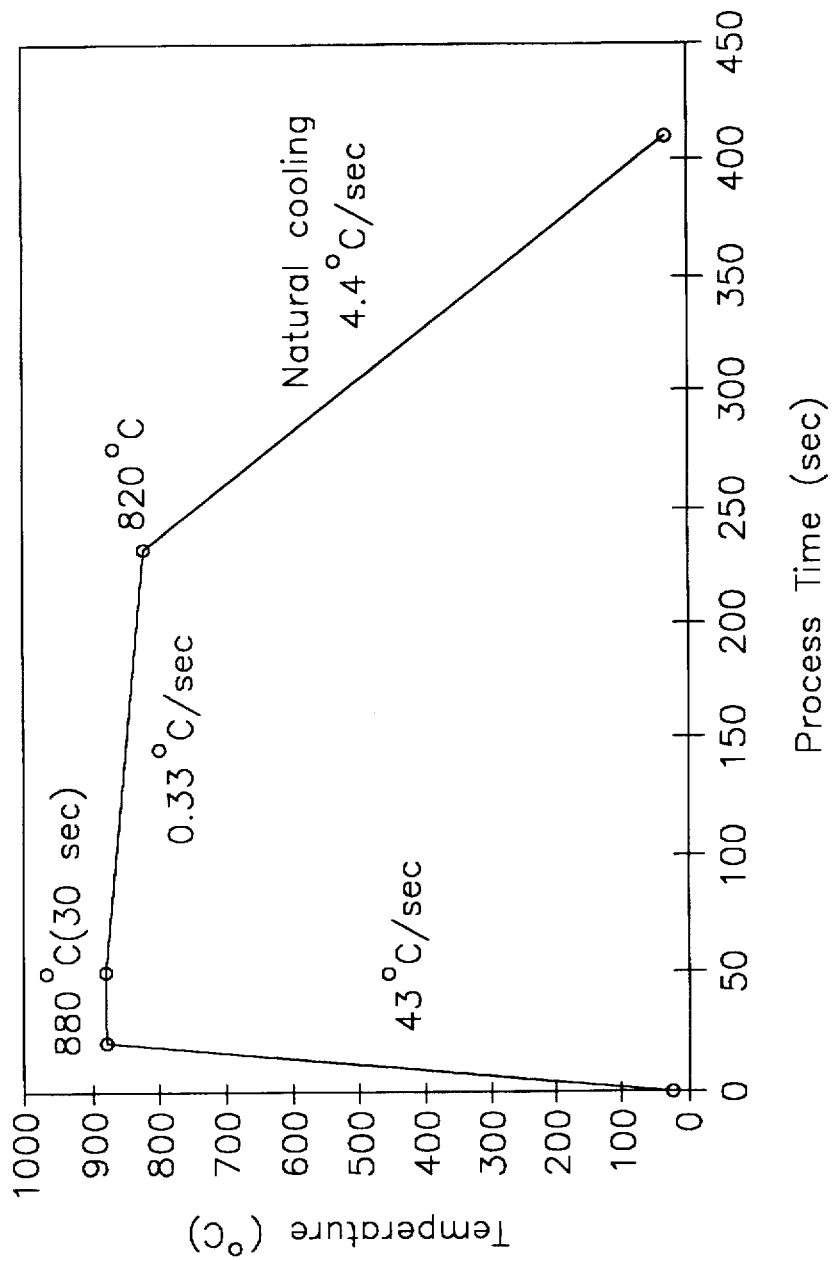
FIG. 5 is a graph showing the temperature cycle for an in situ cooling procedure of the RTP simultaneous diffusion step in the first RTP process of FIG. 4.

After a number of experiments, an appropriate time and temperature profile was established for simultaneous diffusion of both the phosphorus and the aluminum into the silicon substrate 12 with acceptable junction depths, surface doping concentration, reverse saturation currents ($J_{oc}$), and bulk lifetime t for high efficiency solar cells. The optimum temperature profile for simultaneous diffusion of phosphorus and aluminum is shown in FIG. 5. As illustrated in the graph of FIG. 5, the temperature in the RTP system is initially increased, or ramped, to a temperature of 880° C. at a rate of 43° C. per second. After the temperature of 880° C. is achieved, the silicon substrate 12 is maintained at this temperature for 30 seconds. While the silicon substrate 12 is maintained at 880° C., diffusion of both phosphorus and aluminum into the silicon substrate 12 commences. Next, an in situ controlled cooling procedure is employed for preserving minority carrier bulk lifetime t within the silicon substrate 12. Moreover, the in situ controlled cooling procedure permits selective adjustment of the depth of both the p⁺ diffused region and the n⁺ diffused region within the silicon substrate 12.

During the in situ controlled cooling procedure, the temperature within the RTP system is decreased at a rate of 0.33° C. per second for a duration of approximately 180 second to achieve an ultimate temperature of 820° C. During the foregoing time period, the phosphorus and aluminum layers continue to diffuse into the silicon substrate 12, and the depths of the n⁺ region 14 and the p⁺ region 16 within the substrate 12 are directly proportional to the duration of the foregoing cooling period. Next, the temperature in the RTP system is permitted to drop naturally so that the silicon substrate 12 is cooled naturally. In other words, the temperature within the RTP system decreases toward the ambient temperature in and around the RTP system. It has been determined by experiments that the temperature within the RTP system decreases at a rate of approximately 4.4° C. per second during the natural cooling procedure. The specific merits of the foregoing concurrent diffusion and in situ controlled cooling procedure will be further described in detail, after a completion of this discussion regarding the first RTP process 50.

Next, as indicated in flow chart block 55, the metals for forming the front and back contacts 22, 18 are applied to the substrate structure using any suitable materials and techniques. In the preferred embodiment, initially, the phosphorus film is stripped off in a dilute HF solution. The grid of front contacts 22 is defined by evaporating 60-nm Ti and 5-mm Ag using a lift-off photolithography process. Further, the back contact 18 (FIG. 1) is formed by evaporation of 60-mm Ti and 2 mm of aluminum over the entire back followed by a 400° C./30-minute contact-anneal in a suitable forming gas, as is indicated in flow chart block 57.

Finally, a passivation layer and/or an antireflection layer may optionally be applied to the substrate structure. For example, a suitable antireflection coating would be $SiO_x$ or the double layer ZnS/MgF coating. Moreover the passivation layer and/or the antireflection layer may be applied to the structure using any conventional technique. However, in the preferred embodiment, as indicated in flow chart block 58, a plasma enhanced chemical vapor deposition (PECVD) process is utilized to form a double-layer antireflection/passivation coating (AR coating) of $SiN/SiO_x$ on the substrate structure.

The double-layer antireflection/passivation coating $SiN/SiO_x$ is formed to comprise a 59 nm SiN layer with a refractive index of approximately 2.27 and a 95 nm $SiO_x$ layer with a refractive index of 1.46. Moreover, the double-layer antireflection/passivaiton coating $SiN/SiO_x$ is deposited in a total time of less than 9 minutes by PECVD at a low temperature, i.e., less than 300° C., for emitter surface passivation and for a resulting average reflectance of less than about 5.1%. A detailed discussion of the formation of the aforementioned double-layer antireflection/passivation coating is set forth in co-pending application entitled "Process for Low Temperature Plasma Enhanced Chemical Vapor Deposition (PECVD) of an Oxide and Nitride Antireflection Coating on Silicon," filed on May 25, 1994, and having Ser. No. 08/248,473, now U.S. Pat. No. 5,418,019 the disclosure of which is incorporated herein by reference as if set forth in full hereinbelow. In general, the double-layer antireflection/passivation coating $SiN/SiO_x$ results in an excellent antireflection/passivation coating for silicon photovoltaic devices. Furthermore, experimental data shows that this double-layer antireflection/passivation coating also provides very effective defect passivation on silicon solar cells. Therefore, the surface defect passivation and antireflection coating are accomplished in a single step, instead of two process steps for formation of ZnS/MgF as in the prior art.

MERITS OF IN SITU CONTROLLED COOLING PROCEDURE

The specific merits of the in situ controlled cooling procedure will now be further addressed. A number of experiments were performed to select the RTP temperature cycle as shown in FIG. 5. From these experiments, it was determined that the ramping up to a peak temperature of 880° C. and holding for 30 seconds determined the surface concentration, reverse saturation current density $J_o$, and sheet resistance. Similarly, the slow cooling rate of 0.33° C. per second for 3 minutes allows the formation of the aluminum diffused region 16, performs aluminum gettering, and prevents lifetime t degradation due to rapid quenching from high temperatures. The heating and cooling cycle in FIG. 5 also creates appropriate junction depths and diffusion profiles for high efficiency cells.

Figure 6:
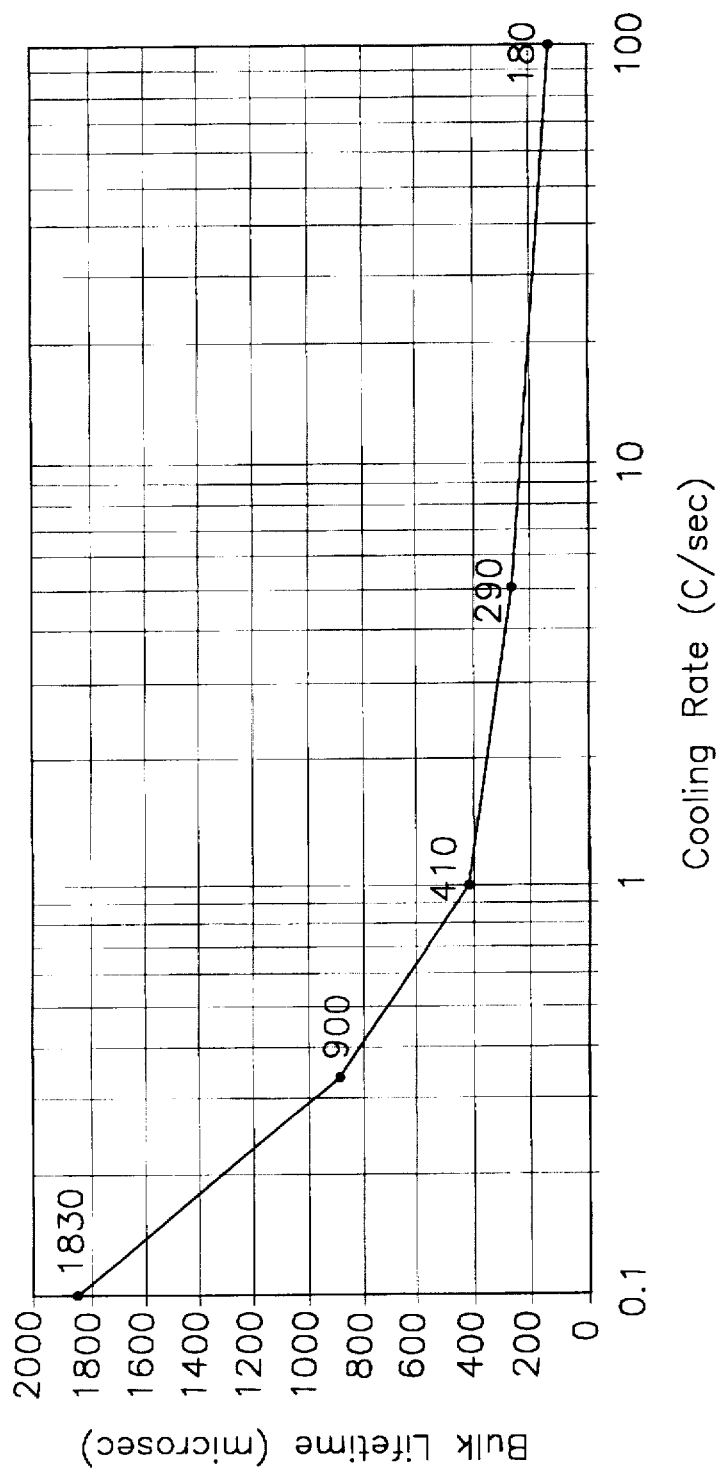
FIG. 6 is a graph of minority carrier bulk lifetime t versus cooling rate, which illustrates the effects of the in situ cooling procedure of FIG. 5 as well as quenching to terminate the RTP process.

In prior art processes, the RTP step is usually concluded by a rapid quenching of the temperature within the RTP system. Researchers in the industry have not recognized, as did the inventors herein, that rapid quenching could be replaced by controlled cooling to preserve minority carrier bulk lifetime t and to adjust the profiles of the diffused regions. FIG. 6 illustrates the minority carrier bulk lifetime t for silicon substrates having an $n^+$ diffused region over a range of cooling rates. As is apparent from FIG. 6, quenching of the temperature within the RTP system severely diminishes the minority carrier bulk lifetime t, whereas a gradual decrease in cooling rate preserves the minority carrier bulk lifetime t.

Figure 7:
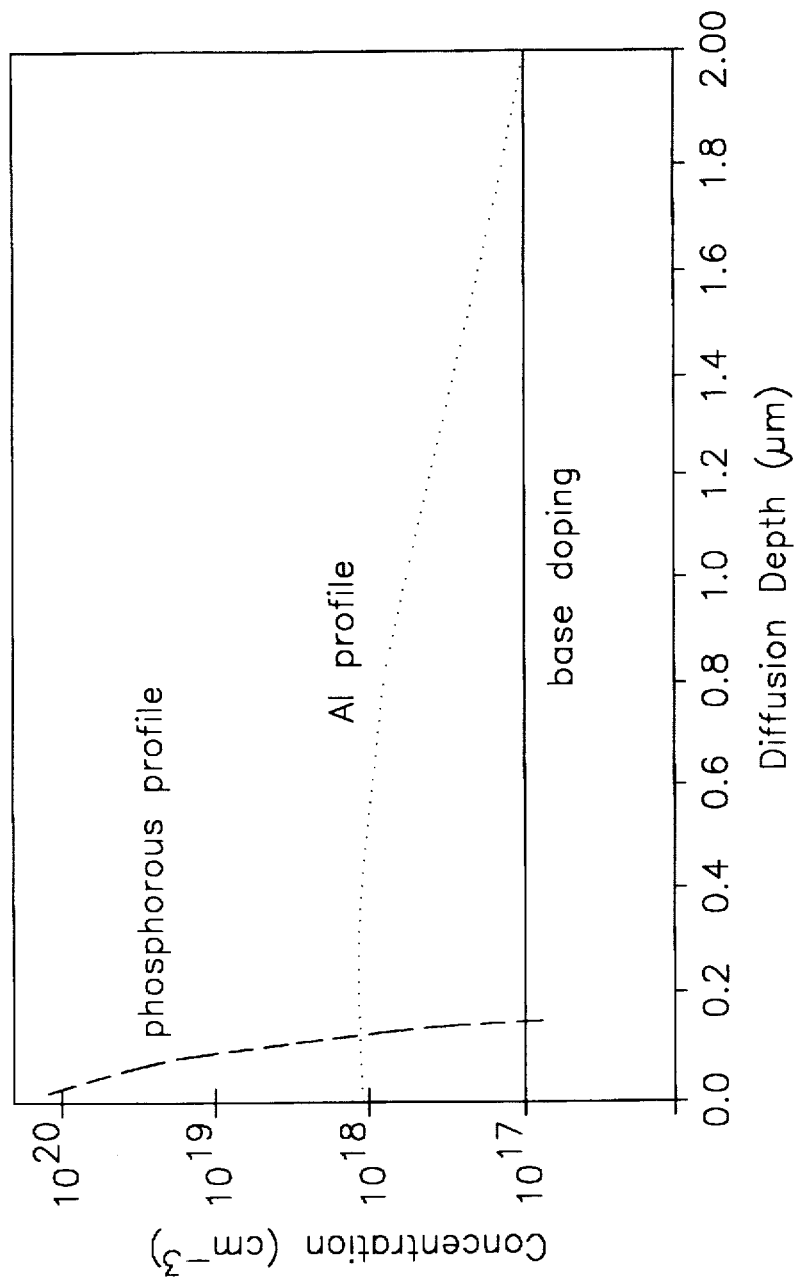
FIG. 7 is a graph showing concentration versus diffusion depth of dopants within the silicon substrate of a silicon solar cell produced in accordance with the first RTP process of FIG. 4.

FIG. 7 shows the front and back diffusion profiles obtained by the processing cycle of FIG. 5. Phosphorus emitter profiles, measured by spreading resistance, had a surface concentration of about $2 \times 10^{20}$ cm$^{-3}$ and a junction depth of 0.15 mm. This resulted in a sheet resistance of 80 ohms/square. The aluminum diffused region profile, determined by C-V measurements using an electrochemical etching profile, had a surface concentration of $10^{18}$ cm$^{-3}$ and a junction depth of 2 mm. These simultaneously diffused profiles are quite consistent with the requirements for high efficiency silicon cells and can be optimized further for even better results.

Figure 8:
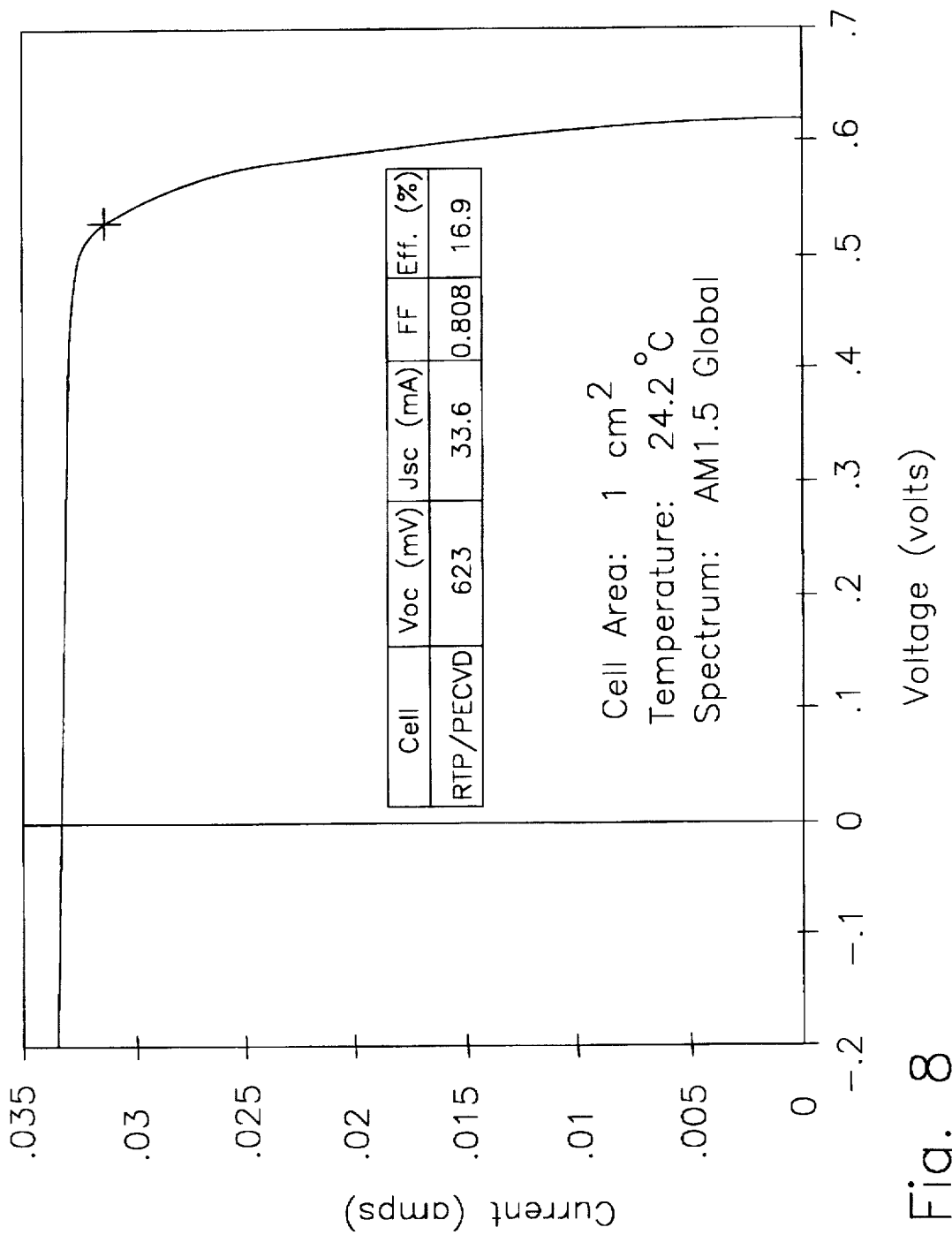
FIG. 8 is a graph of current versus voltage, which is indicative of operational efficiency (%), for a silicon solar cell produced in accordance with the first RTP process of FIG. 4.

FIG. 8 shows the light I-V characteristics and other relevant cell operation data. As shown in FIG. 8, the silicon solar cells fabricated in accordance with the first RTP process 50 have a record high efficiency of 16.9%. The cells had a $V_{oc}$ of 623 mV, $J_{oc}$ of 33.6 mA, and a fill factor of 0.808.

Figure 9:
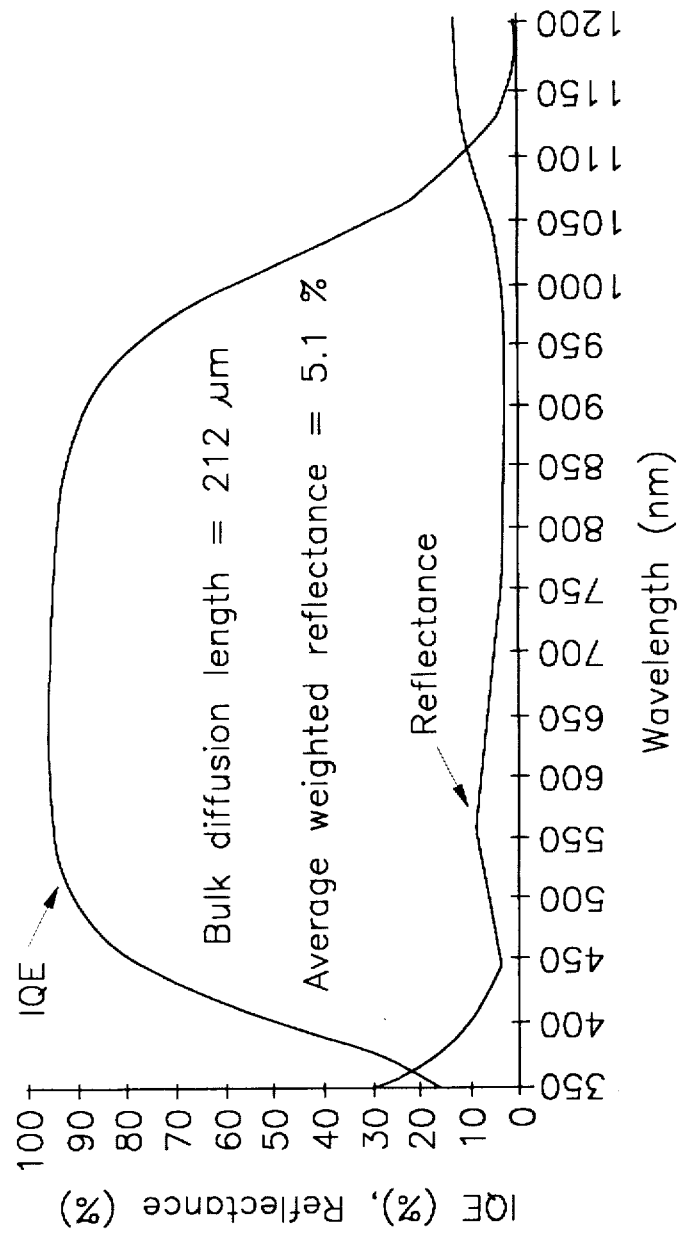
FIG. 9 is a graph of the measured reflectance versus the internal quantum efficiency (IQE) of a cell produced in accordance with the first RTP process of FIG. 4.

FIG. 9 shows the measured reflectance and the internal quantum efficiency (IQE) of a silicon solar cell produced in accordance with the present invention. The IQE analysis shows a bulk diffusion length of 212 mm, corresponding to a bulk lifetime t of about 21 microseconds in the 0.2 ohm-cm base.

Figure 10:
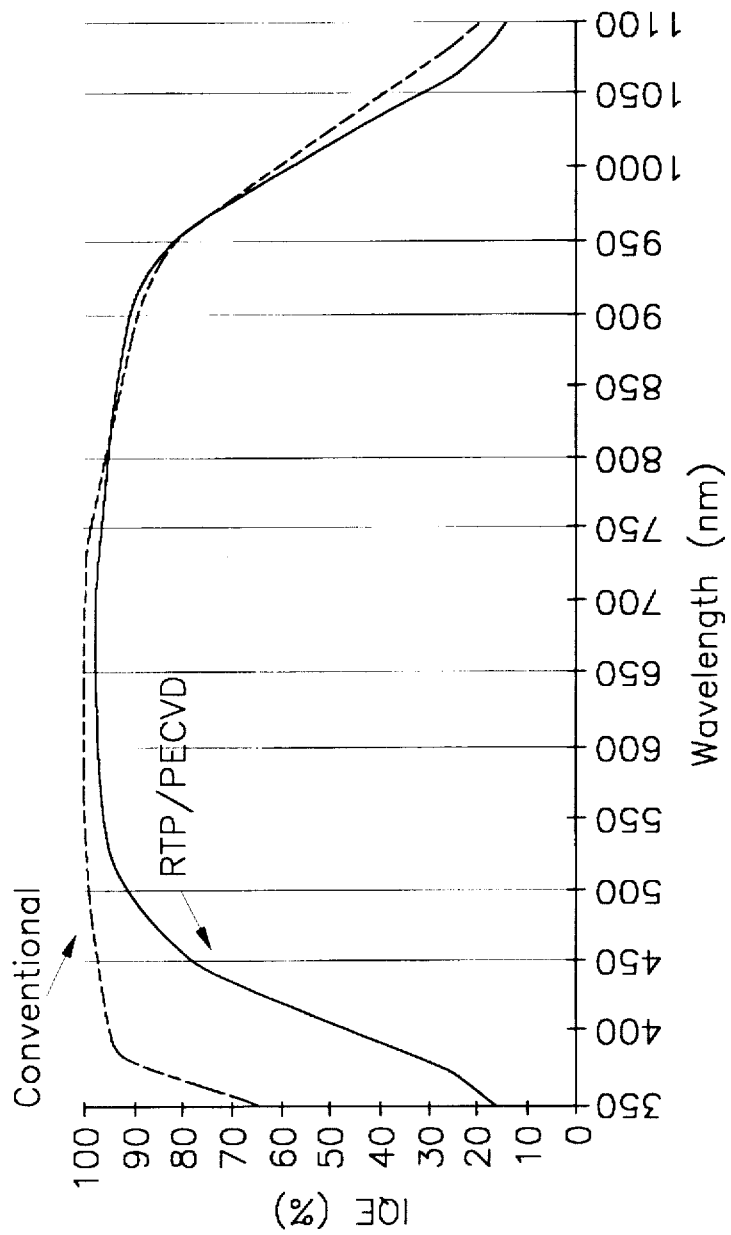
FIG. 10 is a graph of IQE versus light wavelength of a conventional furnace-diffused cell and a cell formed in accordance with the first RTP process of FIG. 4.

FIG. 10 shows a comparison of IQE and cell data of a conventional furnace diffused in RTP diffused cell on 0.2 ohm-cm float zone (FZ silicon). The conventional cell fabrication involved 930° C./25 minutes phosphorus diffusion on the front, followed by an etch back to obtain a comparable emitter sheet resistance of 80 ohm/square, and 850° C.45 minutes aluminum diffusion on the back which includes a 10 minute thermal oxide passivation on the front. The conventional cell gave efficiency of 18.8% with a slightly better long wavelength response, but considerably better short wavelength response, indicating somewhat higher diffusion length (255 mm) and much lower front surface recombination velocity (FSRV). Emitter doping profiled measurements for the conventional cell showed a much lower surface concentration of $2 \times 10^{19}$ cm$^{-3}$ and a junction depth of 0.6 mm. The order of magnitude higher surface concentration of the RTP emitter can increase front surface recombination, Auger recombination, and band gap narrowing to account for the lower short wavelength response. Use of silicon rich SiN (N=2.27) for efficient double-layer AR coating on RTP cells also contributes to lower short wavelength response due to absorption.

MERITS OF FIRST RTP PROCESS

Figure 11A:
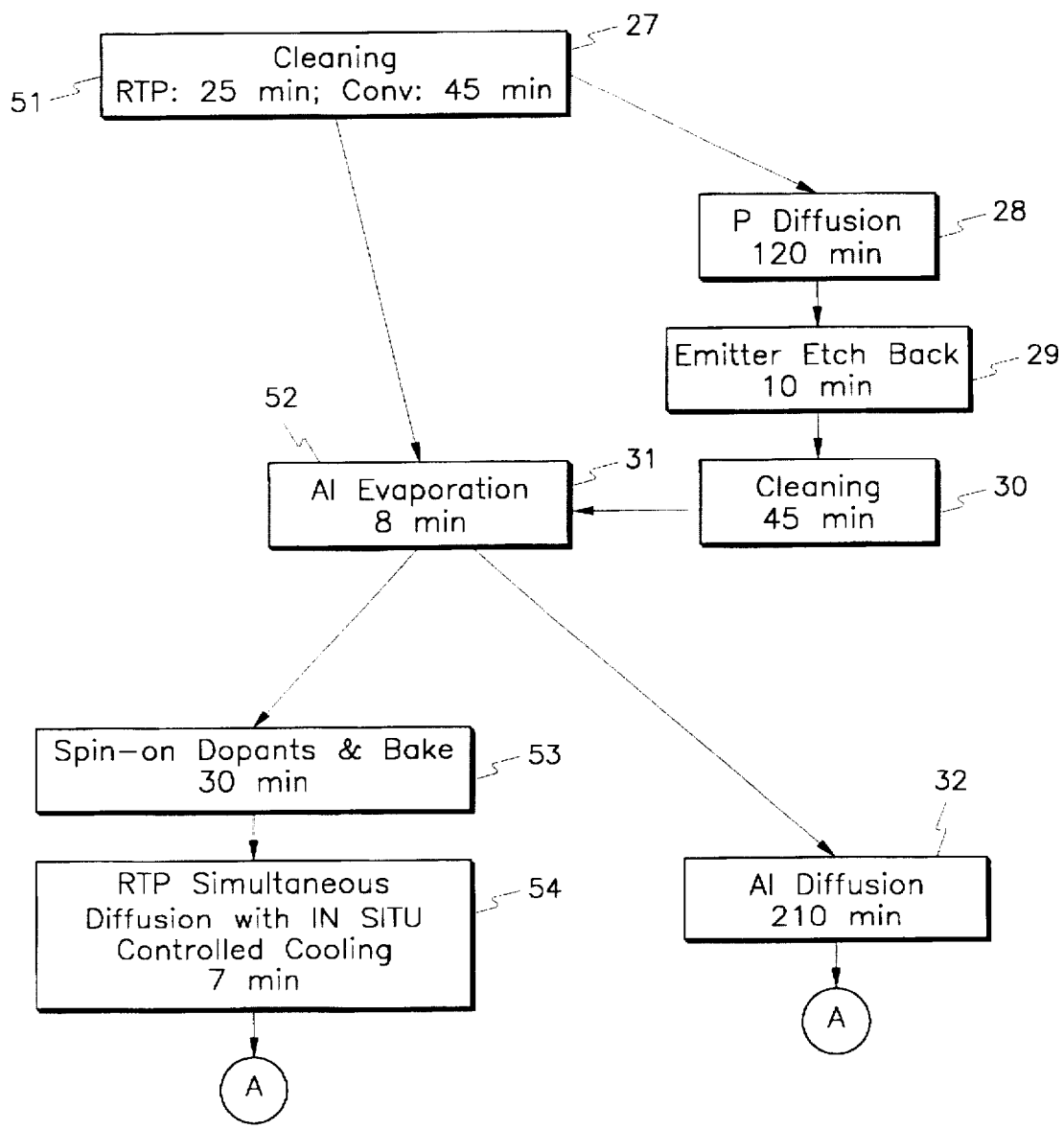
FIGS. 11A and 11B are flow charts illustrating a time comparison between the conventional process of FIG. 2 and the first RTP process 50 of FIG. 4.
Figure 11B:
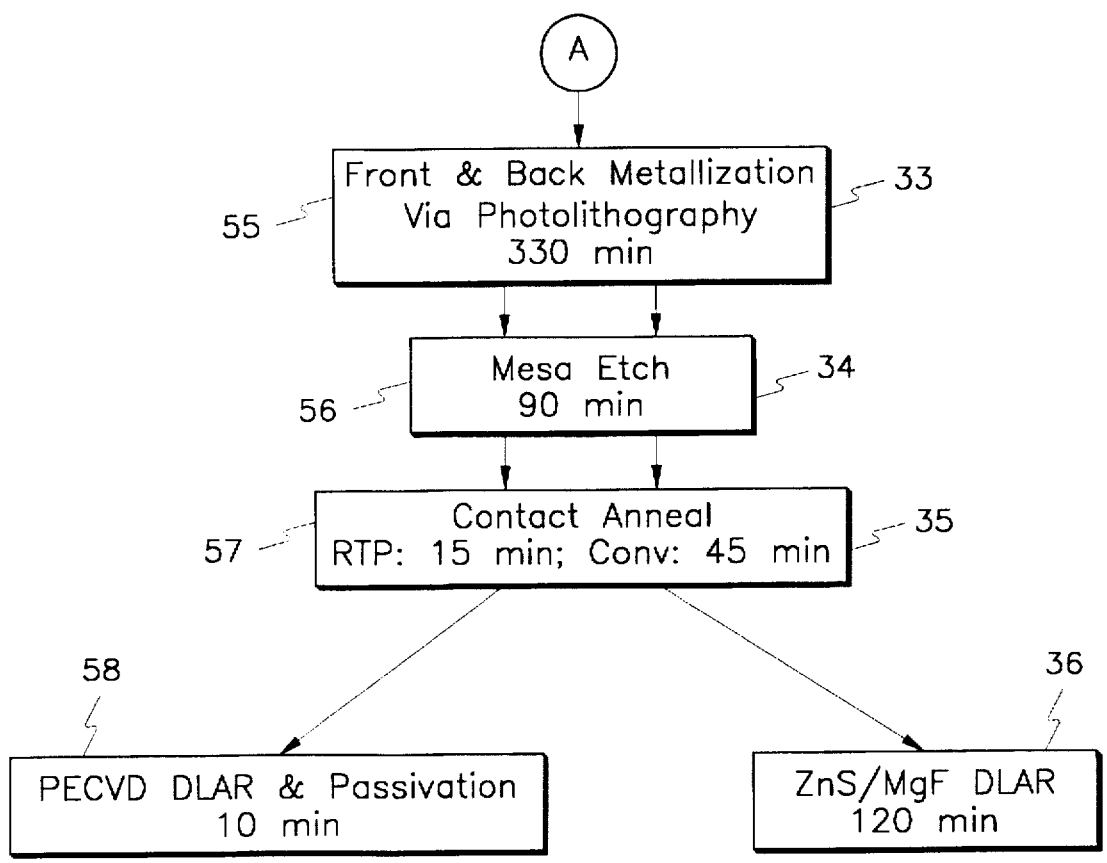

The merits of the first RTP process 50 will now be discussed with respect to FIGS. 11A and 11B. In general, the first RTP process 50 in accordance with the present invention can be used to produce high efficiency silicon solar cells 11 in much less time and at much less cost than conventional processes, particularly the conventional process 26 of FIG. 2. FIGS. 11A and 11B show a flow chart illustrating a comparison between the conventional process 26 of FIG. 2 and the first RTP process 50 of FIG. 4. Common steps are shown centrally in FIGS. 11A and 11B, unique steps of the first RTP process 50 are shown to the left in FIGS. 11A and 11B, and unique steps of the conventional process 26 are shown to the right in FIGS. 11A and 11B. As is apparent from FIGS. 11A and 11B, the first RTP process 50 can be performed in approximately 515 minutes, whereas the conventional process 26 takes about 1,023 minutes. The first RTP process 50 eliminates many of the steps which are performed in the conventional process 26, thereby resulting in an extreme savings of time. The savings in time directly translates into a cost savings, less power consumption, and less requisite chemicals, gases, etc.

SECOND RTP PROCESS

Figure 12:
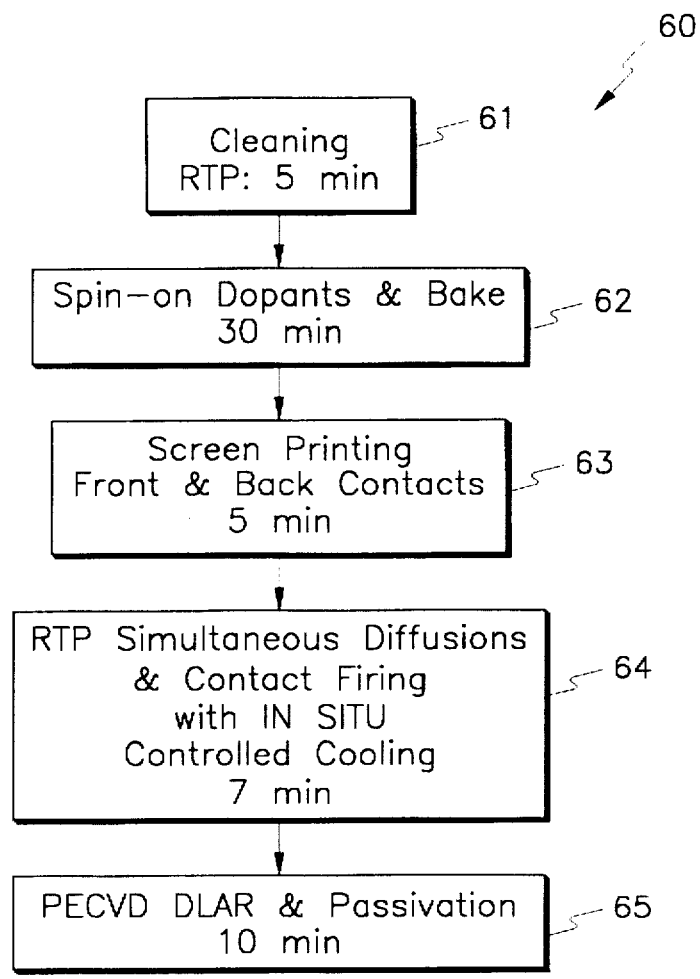
FIG. 12 is a flow chart illustrating a second RTP process in accordance with the present invention for producing the silicon solar cell of FIG. 1 at a much lower cost, in much less time, and with a comparable cell efficiency relative to the conventional process of FIG. 2.

FIG. 12 shows a flow chart illustrating a second RTP process 60 in accordance with the present invention. The second RTP process 60 is an improvement of the first RTP process 50 in that the second RTP process 60 further simplifies the process of fabricating high efficiency silicon solar cells 11 and further minimizes cost. As shown in FIG. 12, particularly at flow chart block 61, the substrate structure is initially cleaned using any suitable means. Next, as is indicated in flow chart block 62, both the first and second dopants are applied to the surfaces of the silicon substrate 12. Preferably, the dopants are applied via a conventional spin-on process, but any other suitable process may be employed.

The front and back contacts 22, 18 (FIG. 1) are then applied to the substrate structure, as indicated in a flow chart block 63. Preferably, the front and back contacts 22, 18 are applied via a screen printing process. This is significant because screen printing is very fast, as compared to other metalization processes.

As indicated in flow chart block 64, the substrate structure is then subjected to heating in an RTP system. The substrate structure is heated in the RTP system in accordance with the temperature profile of FIG. 5. While the substrate structure is heated in the RTP system, the diffused regions 14, 16 (FIG. 1) are formed by diffusion of the phosphorus and aluminum, respectively, into the contiguous silicon substrate 12. Furthermore, the metal contacts 22, 18 are adhered to the substrate structure during the heating process. Hence, in the second RTP process 60, simultaneous diffusion as well as contact firing occurs during a single step of the procedure.

Finally, as shown in flow chart block 65, a passivaiton layer and/or an antireflection layer may optionally be applied to the substrate structure. Preferably, the double-layer antireflection coating SiN/SiO$_x$ is applied to the substrate structure using PECVD, as described previously relative to the first RTP process 50.

The second RTP process 60 can be performed in approximately 57 minutes, as compared to the conventional process 26 of FIG. 2 which takes approximately 1,023 minutes. This substantial savings in time directly translates into a substantial savings in cost, power consumption, and requisite chemicals, gases, etc.

THIRD RTP PROCESS

Figure 13:
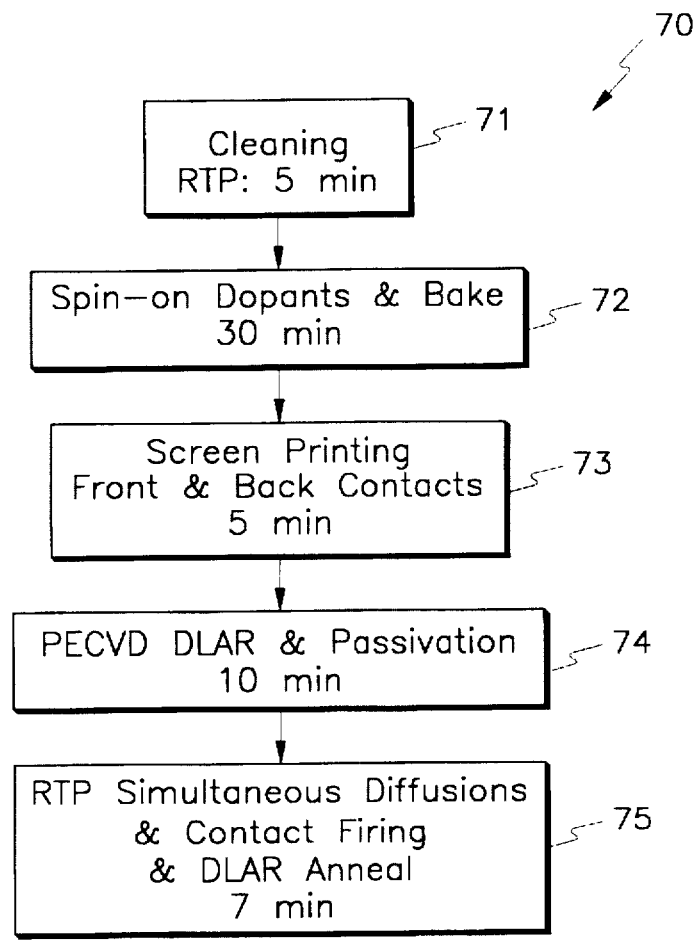
FIG. 13 is a flow chart illustrating a third RTP process in accordance with the present invention for producing the silicon solar cell of FIG. 1 at a much lower cost, in much less time, and with a higher cell efficiency than the conventional process of FIG. 2.

A third RTP process 70 in accordance with the present invention is shown in FIG. 13. The third RTP process 70 further simplifies the process of producing high efficiency silicon solar cells 11 (FIG. 1) and minimizes the requisite time requirements. In essence, in the third RTP process 70 of FIG. 13, the double-layer antireflection/passivaiton coating SiN/SiO$_x$ is applied prior to the RTP step so that the heating cycle associated with the RTP step can also be utilized to adhere the double-layer antireflection/passivation coating SiN/SiO$_x$ to the substrate structure as well as accomplish the simultaneous diffusion and adherence of the front and back contacts 22, 18.

Initially, as is indicated in flow chart block 71, the substrate structure is cleaned using any conventional technique.

Next, as indicated in flow chart block 72, the first and second dopants are applied to the surfaces of the silicon substrate 12. The dopants are preferably phosphorus on the front surface and aluminum on the back surface. Moreover, the dopants are preferably applied using a spin-on process, but any other suitable process could be utilized.

Next, the front and back contacts, 22, 18 are applied to the substrate structure, as is indicated in flow chart block 73. In the preferred embodiment, the front and back contacts 22, 18 are applied using a conventional screen printing process.

The next step in the third RTP process 70 is to optionally apply a passivation layer and/or an antireflection coating. Preferably, as indicated in flow chart block 74, the double-layer antireflection/passivation coating SiN/SiO$_x$ is formed on the substrate structure, as described previously relative to the first and second RTP processes 40, 60.

Finally, the substrate structure is heated in a conventional RTP system utilizing the temperature cycle shown in FIG. 5. As a result of the temperature cycle of FIG. 5, (a) the phosphorus and aluminum dopants concurrently diffuse into the silicon substrate 12, (b) the contacts 22, 18 are adhered to the substrate structure, and (c) the double-layer antireflection/passivation coating SiN/SiO$_x$ is adhered to the substrate structure.

The third RTP process 70 of FIG. 13 can be performed in approximately 57 minutes, which is generally about the same time it takes to perform the second RTP process 60 of FIG. 12. However, the third RTP process 70 of FIG. 13 requires less power and chemicals, because the application of the passivation layer and/or antireflection layer does not require separate heating steps.

It should further be noted that the substrate structure could be further processed prior to the RTP step. More specifically, other diffusion, oxidation, annealing, or deposition steps could take place or be completed during the RTP step.

FOURTH RTP PROCESS

Figures 14, 15:
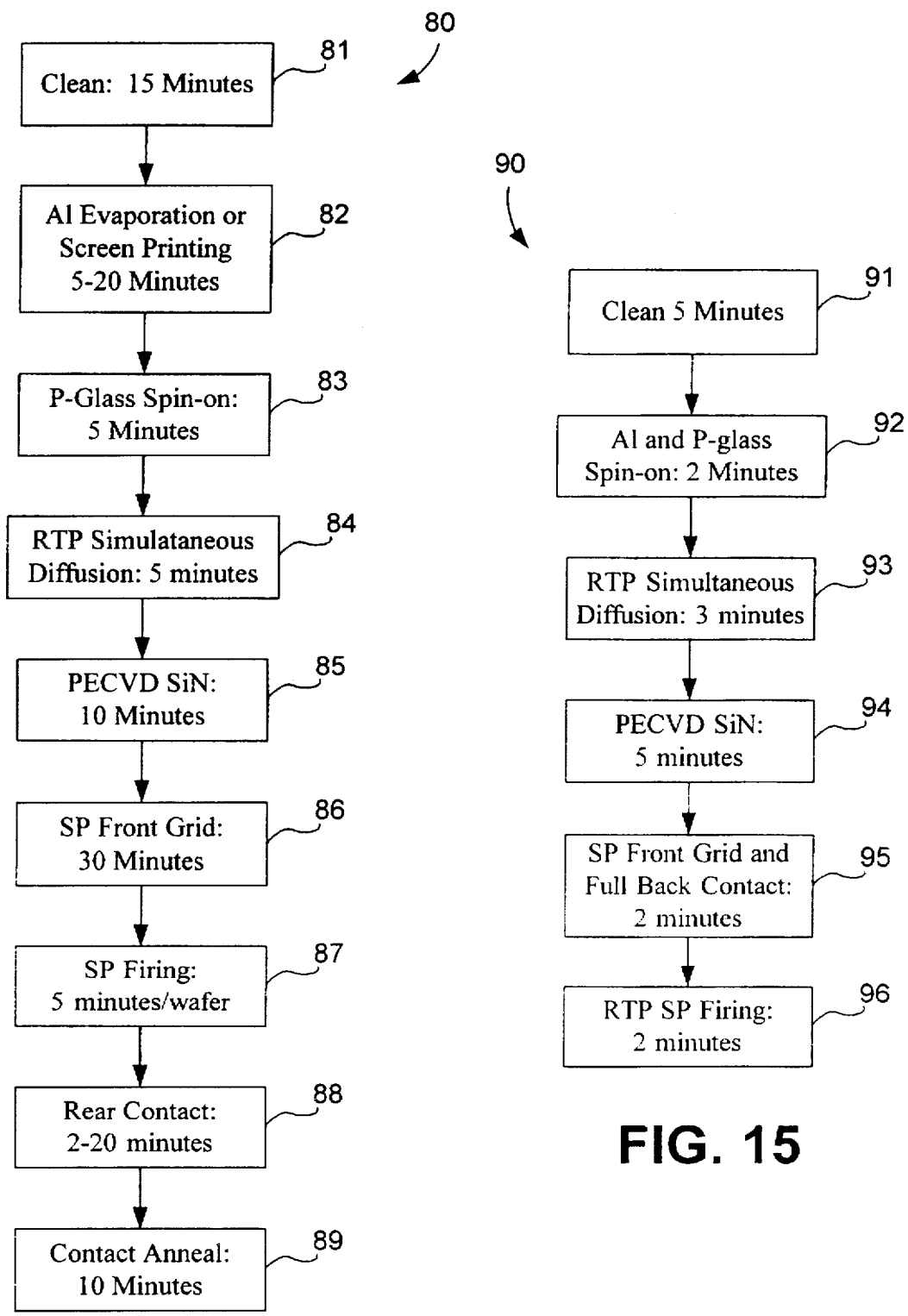
FIG. 14 is a flow chart illustrating a fourth RTP process in accordance with the present invention for producing the silicon solar cell of FIG. 1 at a much lower cost, in much less time, and with a higher solar efficiency that the conventional process of FIG. 2.
FIG. 15 is a flow chart illustrating a fifth RTP process in accordance with the present invention for producing the silicon solar cell of FIG. 1 at a much lower cost, in much less time, and with a higher solar efficiency than the convectional process of FIG. 2.

A fourth RTP process 80 in accordance with the present invention is shown in FIG. 14. The fourth RTP process 80 further simplifies the process of producing high efficiency silicon solar cells 11 (FIG. 1) and minimizes the requisite time requirements. In essence, it was determined that firing the front and back contacts 22, 18 during a single step can compromise the efficiency of the cell. By breaking this process up into two separate steps, the efficiency of the cell 11 can ben enhanced at little time expense. In fact, with the fourth RTP process 80 of FIG. 14, the total fabrication time for the cell 11 is approximately 87–120 minutes and the cell efficiency is approximately 15–16.5%. The time for implementing this process 80 is less than any industry standard process for fabricating silicon solar cells 11, and further, the efficiency of the cell 11 that is produced by the fourth RTP process 80 is at the high end relative to conventional cells 11.

Referring to FIG. 14, initially, as is indicated in flow chart block 81, the substrate structure 12 is cleaned using any conventional technique. As an example, the structure may be cleaned by boiling it in acid (5 min H$_2$SO$_4$/H$_2$O$_2$ bocl+8 min H$_2$O/Hcl/H$_2$O$_2$ socl) and rinsing with deionized water.

Next, as indicated in flow chart block 82, the first dopant, for example but not limited to, aluminum, is applied to the back surface of the silicon substrate 12. The first dopant can be applied using any conventional evaporation or screen printing process, as examples.

Pursuant to block 83, the second dopant, for example but not limited to, phosphorous, is applied to the front surface of the substrate structure 12 using preferably a spin-on process, but any other suitable process could be utilized, for instance, spraying or CVD.

As denoted at block 84, the next step involves utilizing RTP with controlled cooling. The substrate structure 12 is heated in a conventional RTP system utilizing the in situ controlled cooling temperature cycle shown in FIG. 5. The RTP process causes the first and second dopants to diffuse into the respective front and back surfaces of the silicon substrate 12.

In accordance with the next step as indicated at flow chart block 85, an antireflection coating for example but not limited to, silicon nitride (SiN), is applied to the front diffused surface using any suitable PECVD process. A double layer antireflection coating could be deposited, but this would increase the time requirements.

As mentioned previously, the front and back contacts 22, 18 are applied separately, thereby increasing time, but enhancing efficiency. As indicated at flow chart block 86, the front contact is preferably screen printed or evaporated on the structure. The front contact can be, for example, silver, titanium, combinations thereof, or another suitable material.

Next, as denoted at flow chart block 87, the front screen printed contact is adhered to the structure via any suitable annealing or heating process, such as a firing process.

The rear contact 18, for example but not limited to, aluminum, titanium, silver, combinations thereof, or another suitable material, is now applied to the structure, as indicated at flow chart block 88. For example, the rear contact can be applied using a screen printing or evaporation process.

The rear contact 18 is then preferably annealed, a indicated at flow chart block 89. Any suitable annealing or heating process can be employed.

The fourth RTP process 80 of FIG. 14 can be performed in approximately 87–120 minutes. Although this time period is greater than the second and third RTP processes 60, 70, the efficiency of the resultant cells 11 is higher than the cells 11 produced in accordance with the processes 60, 70. Hence, depending upon the application and the desired cell efficiency, the fourth RTP process 80 may be more desirable than any of the other RTP processes described herein.

FIFTH RTP PROCESS

A fifth RTP process 90 in accordance with the present invention is shown in FIG. 15. The fifth RTP process 90 also simplifies the process of producing high efficiency silicon solar cells 11 (FIG. 1) and minimizes the requisite time requirements. The fifth RTP process 90 is the fastest process described in this document for producing cells 11. Further, the cell efficiency of cell 11 manufactured in accordance with this process is approximately 12.5–14% with the potential of reaching higher efficiency with further optimization. This is not the highest cell efficiency of the processes described herein, but this efficiency is very acceptable for most applications in the industry. In other words, this process compromises efficiency slightly in exchange for extreme time savings. The fifth RTP process 90 is described more fully hereafter with reference to FIG. 15. Note that the fifth RTP process 90 utilizes a second RTP step to adhere the contacts to the structure.

Initially, as denoted at flow chart block 91 in FIG. 15, a suitable cleaning process is employed to clean the silicon substrate 12.

The first and second dopants are applied to the surfaces of the structure 12, as denoted in flow chart block 92. The first dopant applied to the back surface of the structure 12 is preferably phosphorous, and the second dopant applied to the front surface of the structure 12 is preferably aluminum. These dopants can be applied to the structure 12 using any conventional process, but preferably a spin-on process. A spraying and CVD process are also possible.

Next, in accordance with flow chart block 93, the substrate structure 12 with dopants undergoes an RTP heating process in a conventional RTP system utilizing the in situ controlled cooling temperature cycle shown in FIG. 5.

An antireflection coating is now applied over the front diffused surface of the substrate structure 12, as indicated at the flow chart block 94. Any suitable antireflection coating can be employed. In the preferred embodiment, the antireflection coating is silicon nitride (SiN). It is possible to apply a double layer antireflection coating, but obviously, this would require more time.

The front and back contacts 22, 18 are applied to the structure, pursuant to flow chart block 95. The front and back contacts can be any suitable metal, such as silver, aluminum, titanium, or combinations thereof. In the preferred embodiment, the front and back contacts are silver and aluminum, respectively. Further, the contacts 22, 18 can be applied using any suitable process, such as a screen printing or evaporation process.

Finally, another RTP step is employed, as denoted at flow chart block 96, in order to fire and adhere the front and back contacts 22, 18 to the structure. However, any suitable annealing or heating process can be employed. This second RTP step in this process 90 helps to reduce time requirements and is very effective at firing and adhering the contacts.

The fifth RTP process 90 of FIG. 15 can be performed in approximately 17–19 minutes, which is the fastest time for any of the RTP processes 50, 60, 70, 80 that are described in this document. Furthermore, the cell efficiency of cells 11 manufactured in accordance with this process 90 is about 12.5–14%, which is completely acceptable in the industry for most applications. Hence, the fifth RTP process 90 may be very desirable for mass production of cells 11.

It should be noted that the time amounts indicated in the flow chart blocks of FIGS. 11–15 are approximations and can probably be minimized to an extent with slight variations in the cleaning procedure, heat application steps, and in situ controlled cooling steps.

It is obvious to one of skill in the art that many variations and modifications may be made to the preferred RTP processes of the present invention as described previously without substantially departing from the spirit and scope of the present invention. All such variations and modification are intended to be included herein within the scope of the present invention, as is defined in the following claims.

Wherefore, the following is claimed:

1. A process for producing a silicon solar cell, comprising the steps of:

cleaning a front and a back surface of a silicon substrate;

applying a first dopant containing material to said back surface of said substrate;

applying a second dopant containing material to said front surface of said substrate;

applying rapid thermal processing to the combination of the substrate and said dopants to cause said first and second dopant containing materials to diffuse into said back and front surfaces, respectively, of said substrate;

controllably cooling said combination so that carrier lifetime in said substrate is preserved;

applying an antireflection coating to said front surface;

applying and adhering via heating a front contact to said antireflection coating; and applying and adhering via heating a rear contact to said back surface.

2. The process of claim 1, wherein said step of applying said first dopant containing material includes the step of evaporating aluminum onto said back surface of said substrate.

3. The process of claim 1, wherein said step of applying said first dopant containing material includes the step of screen printing aluminum onto said back surface of said substrate.

4. The process of claim 1, wherein said step of applying said second dopant containing material includes the step of using a spin-on process to apply phosphorous.

5. The process of claim 1, wherein said step of applying an antireflection coating to said front surface includes the step of utilizing a PECVD process to deposit said coating.

6. The process of claim 5, wherein said antireflection coating is silicon nitride.

7. The process of claim 1, wherein said step of applying said rear contact includes the step of screen printing aluminum.

8. The process of claim 1, wherein said step of applying said rear contact includes the step of evaporating aluminum.

9. The process of claim 1, wherein said step of applying said rear contact includes the step of evaporating titanium.

10. The process of claim 1, wherein said step of applying said front contact includes the step of screen printing silver.

11. The process of claim 1, wherein said step of applying said front contact includes the step of evaporating a combination of titanium and silver.

12. The process of claim 1, wherein said step of controllably cooling includes the steps of:

reducing the amount of applied heat at a first cooling rate, said first cooling rate being slower than the natural cooling rate of said substrate toward ambient temperature; and permitting said combination to naturally decrease in temperature to said ambient temperature after a duration of reduction in the amount of heat at said first cooling rate.

13. The process of claim 1, wherein said step of cooling includes controlling the depth of diffusion of said first and second dopant containing materials into the front and back surfaces of said substrate by the regulation of cooling temperature.

14. A process for producing a silicon solar cell, comprising the steps of:

applying first and second dopant containing materials on the respective front and back surfaces of a silicon substrate to form a combination;

applying rapid thermal processing to said combination to cause said first and second dopant containing materials to diffuse into the respective surfaces of said substrate;

controllably cooling said combination so that carrier lifetime in said substrate is preserved;

applying an antireflection coating to said front surface;

applying a front contact to said antireflection coating;

applying a back contact to said back surface; and applying rapid thermal processing to adhere said front and back contacts to said antireflection coating and said back surface, respectively.

15. The process of claim 14, wherein said step of applying said antireflection coating includes the step of using a PECVD process to apply said antireflection coating.

16. The process of claim 15, wherein said antireflection coating is silicon nitride.

17. The process of claim 14, wherein said step of applying said first and second dopant containing materials further includes the step of spinning-on phosphorous and aluminum as said first and second dopant containing materials, respectively.

18. The process of claim 14, wherein said steps of applying said front and back contacts each include the step of screen printing a combination of silver and aluminum.

19. The process of claim 14, wherein said steps of applying said front and back contacts each include the step of evaporating a combination of titanium and silver.

20. The process of claim 14, wherein said step of cooling includes the steps of:

reducing the amount of applied heat at a first cooling rate, said first cooling rate being slower than the natural cooling rate of said substrate toward ambient temperature; and permitting said combination to naturally decrease in temperature to said ambient temperature after a duration of reduction in the amount of heat at said first cooling rate.

21. The process of claim 14, wherein said step of cooling includes controlling the depth of diffusion of said first and second dopant containing materials by the regulation of cooling temperature.

22. A process for producing silicon solar cells, comprising the steps of:

applying first and second dopant containing materials to the respective front and back surfaces of a silicon substrate to form a combination;

applying rapid thermal processing (RTP) to said combination to cause simultaneous diffusion of said first and second dopant containing materials into the respective surfaces of said substrate;

cooling said combination in a plurality of stages;

employing plasma enhanced chemical vapor deposition (PECVD) to apply an antireflection coating to said front surface; and applying front and back contacts to said antireflection coating and said back surface, respectively.

* * * * *